(12) United States Patent
Ng et al.

(10) Patent No.: US 7,179,743 B2
(45) Date of Patent: Feb. 20, 2007

(54) TITANIUM UNDERLAYER FOR LINES IN SEMICONDUCTOR DEVICES

(75) Inventors: Khim Hong Ng, Singapore (SG); Yeow Keong Ng, Singapore (SG); Kar Hwee Koh, Singapore (SG)

(73) Assignee: Systems on Silicon Manufacturing Company Pte. Ltd., Singapore (SG)

( * ) Notice: Subject to any disclaimer, the term of this patent is extended or adjusted under 35 U.S.C. 154(b) by 41 days.

(21) Appl. No.: 10/510,641

(22) PCT Filed: Jan. 20, 2003

(86) PCT No.: PCT/SG03/00011

§ 371 (c)(1),
(2), (4) Date: Oct. 8, 2004

(87) PCT Pub. No.: WO2004/066383

PCT Pub. Date: Aug. 5, 2004

(65) Prior Publication Data

US 2005/0116350 A1    Jun. 2, 2005

(51) Int. Cl.
*H01L 21/44* (2006.01)

(52) U.S. Cl. .............. 438/685; 438/687; 257/770; 257/E21.204

(58) Field of Classification Search ............. 438/685, 438/687; 257/770
See application file for complete search history.

(56) References Cited

U.S. PATENT DOCUMENTS

| 5,960,320 | A  | * | 9/1999  | Park ............... 438/688 |
| 6,140,224 | A  |   | 10/2000 | Lin |
| 6,346,480 | B2 | * | 2/2002  | Yamamoto et al. ...... 438/688 |
| 6,443,743 | B1 |   | 9/2002  | Saran |

FOREIGN PATENT DOCUMENTS

WO    WO 97/06562 A1    2/1997

* cited by examiner

*Primary Examiner*—Alexander Ghyka
(74) *Attorney, Agent, or Firm*—Rothwell, Figg, Ernst & Manbeck

(57) ABSTRACT

A thin Titanium underlayer 22 is included beneath a Titanium rich Titanium Nitride layer 28 in a metal line 20 on a silicon substrate to reduce stress voiding.

25 Claims, 5 Drawing Sheets

TITANIUM UNDERLAYER FOR LINES IN SEMICONDUCTOR DEVICES

CROSS REFERENCE TO RELATED APPLICATION

This application is a 35 U.S.C. § 371 National Phase Entry Application from PCT/SG2003/000011, filed Jan. 20, 2003, and designating the U.S.

FIELD OF THE INVENTION

The present invention relates to the use of a Titanium (Ti) underlayer, together with a Titanium rich Titanium Nitride (Ti rich TiN) layer. More particularly it relates to the use of such layers with metal lines in semiconductor devices

BACKGROUND ART

Metal lines are used in semiconductor devices to connect components or individual points together. The metal lines are isolated from each other by dielectrics. A typical interconnect line used in semiconductor devices, for instance as is used in CMOS 18 or CMOS 18 shrink, is shown in FIG. 1. The line 2 consists of a main, conductive metal layer of aluminium-copper alloy (AlCu layer) 4, with a Ti rich TiN layer 6 above and a Ti rich TiN underlayer 8, below.

In an alternative (not shown), both Ti rich TiN layers are replaced with a TiN layer on top of a Ti layer. Such a combination is, for instance shown in published patent document EP-A-0,875,923. According to that document, it is critical that the bottom Ti underlayer has a thickness of from about 90 to about 110 Angstroms ($10^{-10}$ m). It is exemplified by a metal stack as follows:

x ÅTi/100 ÅTiN/2300 ÅAl (0.5% Cu)/50 ÅTi/ 400 ÅTiN where there were five different thicknesses x between 30 and 200 (Å).

A similar combination is shown in published patent document U.S. Pat. No. B2-6,346,480, where the exemplified stack is:

30 nm Ti/100 nm TiN/450 nm Al—Cu/15 nm Ti/ 50 nm TiN.

Similar combinations of varying thicknesses are also shown in a number of other published patent documents, for example: U.S. Pat. No. B1-6,319,727 and U.S. Pat. No. 6,080,657. Other combinations are also known, for instance a TiN or Ti underlayer, beneath a $TiAl_3$ layer, beneath a main Aluminium layer beneath another TiN or Ti layer.

The intervening dielectrics between such known lines are deposited by way of chemical vapour deposition (CVD) techniques. However, the encapsulating dielectrics subject the metal lines to mechanical tensile stresses, which result in stress induced voids (SIV) in the metal lines. Intrinsically, such dielectrics are compressive films, i.e. the AlCu lines which are encapsulated experience tensile stresses. The stress voids occur as a result of the tensile forces on the grain boundaries. This problem is pronounced when the intermetal dielectric is deposited using high density plasma (HDP) methods, as such materials are known to impart large tensile stresses on the metal lines.

The tensile stresses are also increased when the coefficient of thermal expansion (CTE) between the AlCu interconnect metal lines differ. Thus, when the semiconductor device experiences thermal cycles during its lifetime, the tensile stresses induced on the metal lines are large enough to cause SIVs.

Typically SIVs are wedge shaped voids in the metal lines. Such voids/cracks occur where the yield stress is lowest, which is at the grain boundaries of the metal interconnect lines. In general, the methodology for evaluating such voids is by subjecting the completed semiconductor devices to a period of thermal stress and then checking for SIVs by delayering away the passivating dielectrics and inspecting under a scanning electron microscope (SEM). Typical stress voids are wedge shaped and occur at the grain boundaries where the yield stress is lowest. FIGS. 2A and 2B show two views of three AlCu metal interconnect lines 2 after the passivating dielectrics are removed. FIG. 2A is a top plan view and FIG. 2B an isometric view. A stress induced void 10 is clearly present on one of the lines, being approximately 300 nm long and 100 nm across the width of the line (about one third of the width of the line). However, the voids can be any size and depth, even to the extent of breaking the metal line.

SIVs in AlCu interconnect lines are a reliability concern, as the increase in the resistance of the metal line (as a result of the reduced cross sectional area) will result in device failure, either as a consequence of the increase in the RC time delay constant or because of structural failure if the metal opens. If a fabrication plant is unable to control or avoid such voids, it is unable to obtain suitable qualification for production of relevant devices.

SUMMARY OF THE INVENTION

It is an aim of the present invention to provide a new metal line. Ideally it would at least partially alleviate the problems with the prior art and reduce the presence of stress voids.

According to one aspect of the present invention, there is provided a conductive line for a semiconductor device including: a first conductive layer; a Titanium layer; and a first Titanium rich Titanium Nitride layer between the first conductive layer and the Titanium layer.

The invention also provides a silicon substrate having a plurality of such conductive lines thereon.

According to another aspect of the present invention, there is provided a process for manufacturing a conductive line, comprising the steps of: depositing a Titanium layer onto a substrate; depositing a first Titanium rich Titanium Nitride layer to the other side of said Titanium layer relative to said substrate; and depositing a first conductive layer to the other side of said first Titanium rich Titanium Nitride layer relative to said Titanium layer.

In general terms, the invention is the provision of a Titanium underlayer beneath a Titanium rich Titanium Nitride layer in a metal line on a silicon substrate to reduce stress voiding. The Titanium underlayer is preferably thin.

The Titanium layer is preferably a 75 Å layer, providing an actual thickness of about 60 to 110 Å.

The invention also provides semiconductor devices, memories and integrated circuits including one or more such conductive lines.

BRIEF SUMMARY OF THE DRAWINGS

The invention will now be further described, by way of non-limitative example with reference to the accompanying drawings, in which.

SPECIFIC DESCRIPTION

Figure 1:
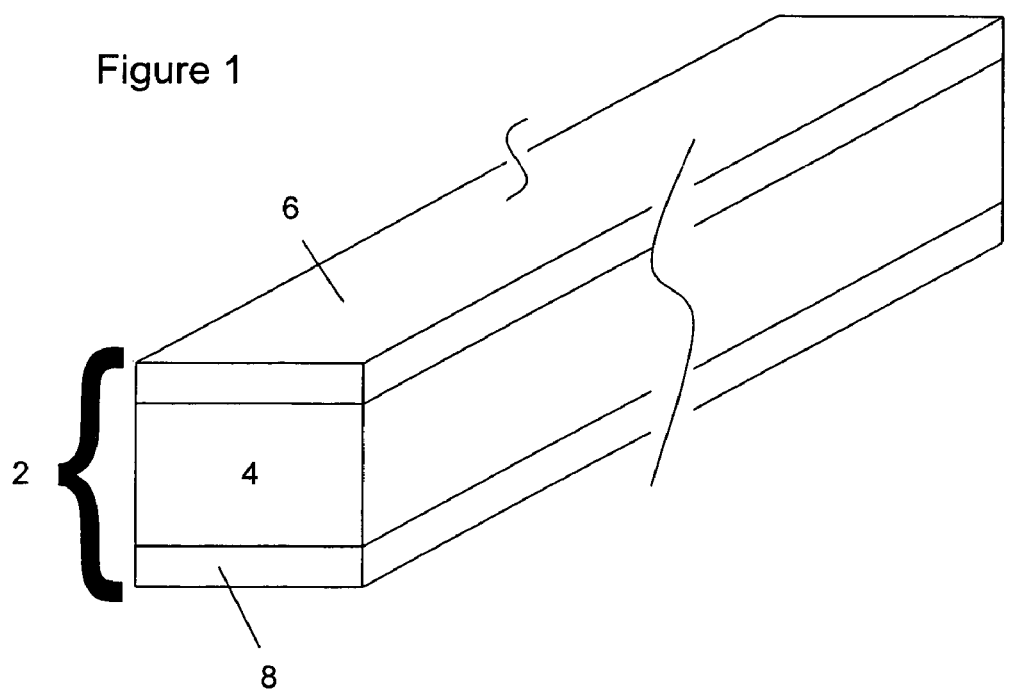
FIG. 1 is a schematic view of a cross-section of a prior art metal line.

In the following description and elsewhere the thicknesses of various layers are given. In relation to the present invention, except when otherwise indicated, these are nominal thicknesses, based on deposition time and deposited rate. These may differ from actual thicknesses due to difficulties in obtaining accurate deposits. This is typical in the wafer fabrication business.

The following description relates mainly to a process for producing interconnect lines for CMOS 18 structures. A typical 18 μm (micron) technology integrated circuit has six metal layers, with silicon-rich-oxide liners and intermetal dielectrics (IMDs) between the layers. Each metal layer typically consists of an AlCu layer sandwiched between Ti or TiN layers. The relative thicknesses for the components of each layer can vary through the stack. With layer M1 being the lowermost layer and layer M6 being the uppermost, the thicknesses of the layers of a typical current metal stack may be constituted as follows:

M1–M4 : 250A Ti rich TiN/4000A AlCu/250A Ti-rich TiN

M5–M6 : 500A Ti rich TiN/8000A AlCu/250A Ti-rich TiN

With the intention of overcoming the SIV problem, the inventors tried various experiments, including: varying the use of $N_2O$ during CVD or annealing, varying the etching machine, varying aspects of post etch cleaning, breaking the vacuum between TiN and AlCu deposition, modifying the metal strip recipe, modifying the high density plasma recipe, using sub-atmospheric (SA) CVD for the intermetal dielectric between layers M5 and M6 (IMD5) and providing a thicker silicon-rich-oxide liner on the metal line between the metal line and the IMD. None of these worked. For example SA CVD is known to impart, intrinsically, compressive stresses on the metal lines, which would prevent metal stress voids. However, SACVD is intrinsically in tension at all times, which makes it susceptible to cracking The inventors then tried other approaches, in particular experiments based on variation in the Metal 1 level in CMOS 18 to examine metal stack changes and metal deposition temperatures on SIV. It was thought that by modifying the underlying barrier metal or by changing the deposition temperatures, it could help to change the grain structure of the metal lines and/or act as a stress relief layer, so as to reduce the tensile stress on the metal lines. The details of the different combinations of materials, their thicknesses and deposition temperatures are shown in Table 1.

TABLE 1

| Expt No. | Stack Composition - All figures in Å ($10^{-10}$ m) | Deposit Temp (° C.) |
|---|---|---|
| 1a | 75stdTi/4000AlCu/250TixTN | 270 |
| 1b | | 450 |
| 2a | 150stdTi/4000AlCu/250TixTN | 270 |
| 2b | | 450 |
| 3a | 250TixTN/Flash Ti100/4000AlCu/250TixTN | 270 |
| 3b | | 450 |
| 4a | 300stdTi/250TixTN/4000AlCu/250TixTN | 270 |
| 4b | | 450 |
| 5a | 250TixTN/4000AlCu/250TixTN | 300 |
| 5b | | 350 |
| 5c | | 400 |
| 5d | | 450 |
| 6a | 150ALPS Ti/100TiN/4000AlCu/250TixTN | 270 |
| 6b | 250ALPS Ti/100TiN/4000AlCu/250TixTN | 270 |
| 6c | 250ALPS Ti/100TiN/4000AlCu/250TixTN | 270 |
| 6d | 300ALPS Ti/100TiN/4000AlCu/250TixTN | 270 |
| 6e | 300ALPS Ti/100TiN/4000AlCu/250TixTN | 450 |
| 7 | 160IMP Ti/70CVD TiN/4000AlCu/250TixTN | 270 |
| 8 | 160IMP Ti/4000AlCu/250TixTN | 270 | where
"std": pure Ti that is deposited by standard Physical Vapour deposition (PVD) methods.
"Flash": another name referring to pure Ti.
"ALPS": Advanced Low Pressure Sputtering
"IMP": Ionised Metal Plasma
"TixTN": Ti-rich Ti-Nitride - The TixTN is deposited by first sputter-depositing Ti for a few seconds and then flowing $N_2$ gas into the chamber to form a TiN layer.

For each experimental stack two different types of structures were created, on the same wafer, for different tests. The structures are shown in FIGS. 3A and 3B.

Figure 3A:
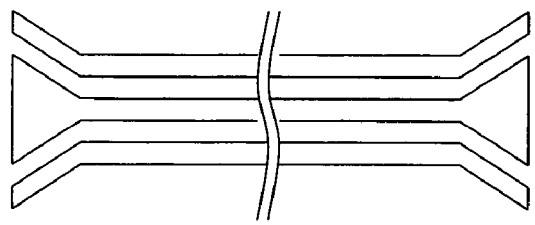
FIGS. 3A & 3B show different test structures used to test the metal lines produced.

FIG. 3A shows an NIST (National Institute of Standards and Technology—US) test structure. It is a small elecromigration Extrusion-type structure, having 3 lines and being 800 μm (microns) long, with a pattern density (PD) of about 48%.

Figure 3B:
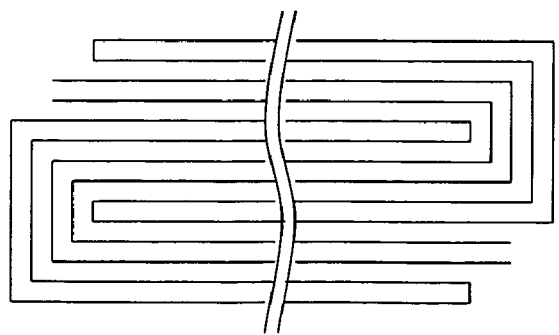
Figure 2A:
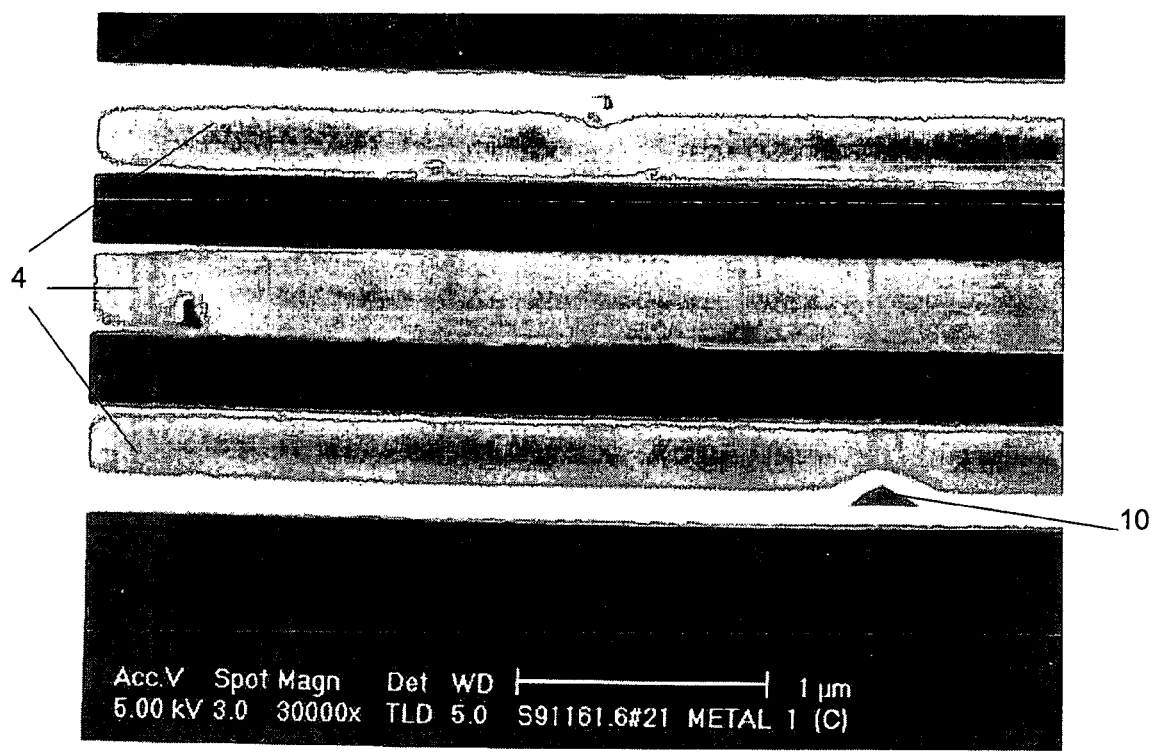
FIGS. 2A & 2B are enlarged views of a prior art set of metal lines, with various layers stripped away, showing the presence of a stress induced void.
Figure 2B:
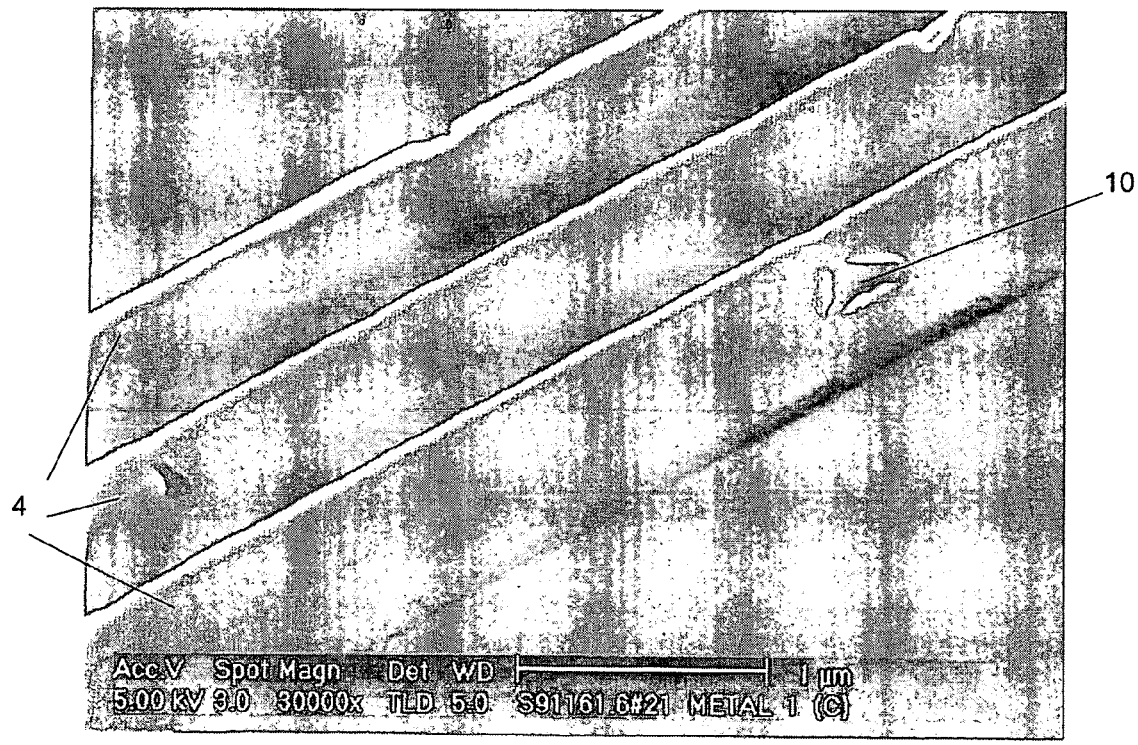

FIG. 3B shows a second, yield module (YM) test structure, with a large, comb meander-type structure, with metal layers M1 to M4 having a top surface area of 6.66 mm² and metal layers M5 to M6 having a top surface area of 20 mm², with a PD of about 50%. This is a typical type of metal structure that can be expected in an integrated circuit.

To be acceptable the results from a production process must pass a post stress SIV visual inspection on a sample from each layer. The inspection requires that the wafer be stressed, for instance by keeping at 200° C. for 24 hours. The passivation layer and the IMD layers are removed through delayering and reactive ion etching (RIE) to expose all the metal lines. This is followed by a visual inspection of design rule structures in a SEM. For both NIST and the second (YM) tests, the necessary criteria for passing are shown in Table 2.

TABLE 2

| Stress void size (as % of width of metal line) | Criteria |
|---|---|
| 10–25% | <30 voids/cm |
| 25–50% | <10 voids/cm |
| >50% | 0 voids/cm |

The results of the two tests on the various experimental stacks are shown in Table 3.

TABLE 3

| Expt | YM | | | NIST | | |
|---|---|---|---|---|---|---|
| No. | 10–25% | 25–50% | >50% | 10–25% | 25–50% | >50% |
| 1a | 375 | 0 | 0 | 525 | 112.5 | 0 |
| 2a | 4375 | 875 | 0 | 462.5 | 125 | 0 |
| 2b | 10000 | 1500 | 0 | 1875 | 575 | 0 |
| 3a | 17500 | 15000 | 0 | 2000 | 1262.5 | 0 |
| 3b | 4250 | 875 | 0 | 1137.5 | 925 | 50 |
| 4a | 0 | 0 | 0 | 35 | 0 | 0 |
| 4b | 0 | 0 | 0 | 62.5 | 12.5 | 0 |
| 5a | 0 | 0 | 0 | 37.5 | 12.5 | 0 |
| 5b | 0 | 0 | 0 | 500 | 200 | 0 |
| 5c | 0 | 0 | 0 | 225 | 0 | 0 |
| 5d | 0 | 0 | 0 | 12.5 | 0 | 0 |
| 6a | 625 | 1250 | 0 | 125 | 450 | 37.5 |
| 6b | 875 | 375 | 0 | 12.5 | 0 | 0 |
| 6c | 1000 | 500 | 0 | 0 | 0 | 0 |
| 6d | 1500 | 625 | 0 | 225 | 500 | 125 |
| 6e | 1125 | 500 | 0 | 125 | 112.5 | 0 |
| 7 | 250 | 0 | 0 | 150 | 0 | 0 |
| 8 | 2500 | 125 | 0 | 2250 | 450 | 0 |

The actual counts were conducted over 80 μm (microns) and the results multiplied up by 12.5.

Thus experimental stack No. 5a passes all the criteria for the YM test structure, but fails one of them for the NIST structure. In particular, there are 37.5 voids/cm along the metal line whose size is between 10–25% of the width of the metal line. This is greater than the 30 voids/cm allowed. There are also 12.5 voids/cm whose size is between 25–50% of the width of the metal line. This is greater than the 10 voids/cm allowed.

Stack 1b was not tested as stack 1a did not work and it was deemed pointless to consider stack 1b.

From the results, it can be seen that experiment No. 4a (300 Å Ti underlayer beneath the current metal stack) shows some of the most promising results. From this table other layers would also appear to be promising, but were not useful for other reasons. For instance, stack 5d was not considered because it was not compatible with the IMD being, which was a fluorinated silicate glass (FSG). At a high temperature of 450° C., the fluorine would outgas and (among other things) cause corrosion to the metal lines.

Further experiments were then necessary to determine the optimal thickness of the Ti underlayer. New stacks were produced, with a Ti underlayer deposit at different temperatures and different thicknesses beneath a 250TixTN/4000Al/250TixTN stack, as shown in Table 4.

TABLE 4

| Expt | Deposit Temp. ° C. | | Ti Underlayer Thickness Angstroms ($10^{-10}$ m) | | | | | |
|---|---|---|---|---|---|---|---|---|
| No. | 100 | 150 | 0 | 75 | 150 | 200 | 300 | 450 |
| 11 | X | | | X | | | | |
| 12 | X | | | | X | | | |
| 13 | X | | | | | X | | |
| 14 | X | | | | | | X | |
| 15 | X | | | | | | | X |
| 16 | | X | | | | X | | |
| 17 | | X | | | | | X | |
| 18 | | X | | | | | | X |

The maximum nominal thickness is a 450 Å Ti underlayer. Typically this might lead to a physical thickness of up to 500 Å. The thinnest layer tried was 75 Å (nominal). Thinner layers may be possible but become increasingly difficult to achieve.

The visual SIV results for these experiments are shown in Table 5

TABLE 5

| Expt | | YM | | | NIST | | |
|---|---|---|---|---|---|---|---|
| No. | Yield % | 0–25% | 25–50% | >50% | 0–25% | 25–50% | >50% |
| 11 | 82.5 | 0 | 0 | 0 | 0 | 0 | 0 |
| 12 | 75.9 | 0 | 0 | 0 | 12.5 | 0 | 0 |
| 13 | 74.7 | 0 | 125 | 0 | 25 | 0 | 0 |
| 14 | 69.3 | 0 | 0 | 0 | 0 | 0 | 0 |
| 15 | 65.7 | 0 | 0 | 0 | 25 | 0 | 0 |
| 16 | 71.7 | 0 | 0 | 0 | 0 | 0 | 0 |
| 17 | 63.3 | 0 | 0 | 0 | 0 | 0 | 0 |
| 18 | 68.1 | 0 | 0 | 0 | 62.5 | 0 | 0 |

Completed wafers were tested electrically. The yield indicated in Table 5 is the number of passing integrated circuits (ICs) compared to the total number of ICs, given as a percentage.

Thus the clearest results are from experiments 1, 4, 6 and 7. However, of these the highest yield was achieved in experiment no. 11. This experiment shows that a 75 Å Ti underlayer deposited at 150° C. is sufficient to improve the SIV substantially. It is generally desired for the Ti thickness to be as thin as possible to reduce deposition time and to reduce the impact for the metal etch process. Lower production temperatures are also preferred, mainly for fear of the fluorine outgassing from the FSG. It is also desirable to reduce the thermal budget for the transistors, which may show some drift in characteristics when the thermal budget changes.

Figure 4:
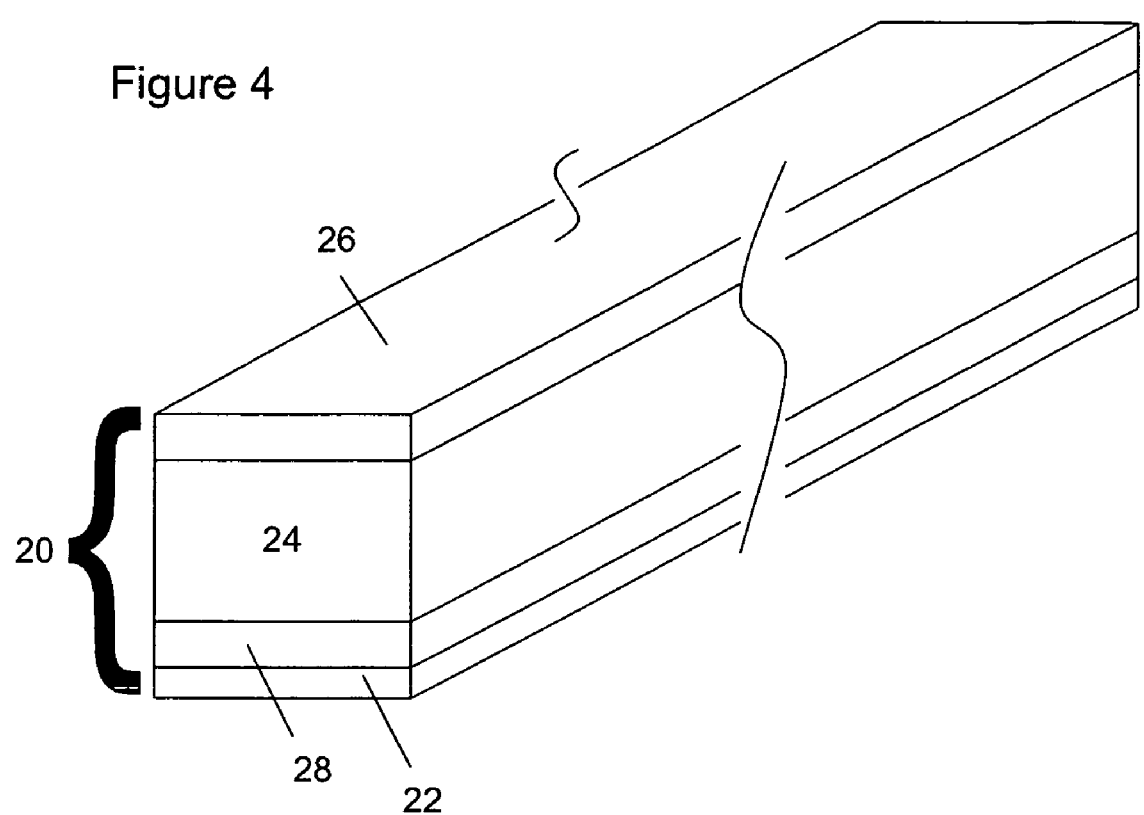
FIG. 4 is a schematic view of a cross-section of a metal line of the present invention.

An interconnect line of the present invention to be used in semiconductor devices, for instance in CMOS 18 or CMOS 18 shrink, is therefore shown in FIG. 4. This is at least nominally similar in cross-section to the line of FIG. 1, differing in the addition of the Ti underlayer 22, and the result it has on the other layers. The line 20 thus consists of a main, conductive metal layer of aluminium-copper alloy (AlCu layer) 24, with a Ti rich TiN layer 26 above and a Ti rich TiN underlayer 28, below, and a Ti layer 22 lowermost.

Further experiments were conducted to qualify the extra 75 Å Ti underlayer. Metal lines were deposited on a number of wafers, in NIST test structures, using different amounts of DC power. One lot was deposited at 1500 W and another at 2000 W. The difference that this makes is in the deposition rate. The higher the DC power, the faster the deposition rate. From a process point of view, 1500 W Ti is preferred over 2000 W Ti due to better thickness control. The lower power requirement allows better process tuning and control of thickness. The construction of lines on each wafer involved metal layer deposit, followed by standard photolithography and standard etching for each of layers M1–M6. Table 6 shows the structure of each layer

TABLE 6

| M1–M4 Deposit | 75 Å Ti | 250 Å TixTN | 4000 Å AlCu | 250 Å TixTN | SiON deposit |
| M5–M6 Deposit | 75 Å Ti | 500 Å TixTN | 8000 Å AlCu | 250 Å TixTN | SiON deposit |

The SIV visual inspection results for a 1500 W Ti recipe wafer is shown in Table 7. This was post stressing at 200° C. for 24 hours.

TABLE 7

| Stress void size (as % of width of metal line) | Total No. of Voids in Metal Layers/cm | | | | | | Maximum Allowed |
| --- | --- | --- | --- | --- | --- | --- | --- |
| | M1 | M2 | M3 | M4 | M5 | M6 | |
| 10%–25% | 4 | 0 | 4 | 0 | 0 | 0 | 30/cm |
| 25%–50% | 4 | 0 | 0 | 0 | 0 | 0 | 10/cm |
| >50% | 0 | 0 | 0 | 0 | 0 | 0 | 0/cm |

The SIV visual inspection results for a 2000 W Ti recipe wafer is shown in Table 8. This was post stressing at 200° C. for 24 hours.

TABLE 8

| Stress void size (as % of width of metal line) | Total No. of Voids in Metal Layers/cm | | | | | | Maximum Allowed |
| --- | --- | --- | --- | --- | --- | --- | --- |
| | M1 | M2 | M3 | M4 | M5 | M6 | |
| 10%–25% | 0 | 13 | 0 | 0 | 0 | 0 | 30/cm |
| 25%–50% | 0 | 4 | 0 | 0 | 0 | 0 | 10/cm |
| >50% | 0 | 0 | 0 | 0 | 0 | 0 | 0/cm |

In this case, the M2 layer is the worst due to experimental variation.

As can be seen by comparing the results with the maxima in the last column in each of Tables 7 and 8, all SIV visual criteria are met for both Ti underlayer recipes.

A yield study was conducted with several of the wafers. There was no statistical difference in the yield between the two recipes for Ti underlayer deposit.

Metal sheet resistances were also compared against baseline lots. Comparison of the sheet resistances with baseline lots for three months showed that the addition of the 75 Å Ti underlayer did not affect the sheet resistance of the metal lines for thin and thick metal lines.

In order to know the effects of the extra 75 Å Ti underlayer on metal etch on metal bridging and continuity, separate window checks were done. The main conclusion from the window experiments is that the current metal etch for CMOS18 and CMOS18 Shrink would be able to cope with the extra 75 Å Ti without any amendments to the etch recipe. The metal continuity and bridging of the metal lines would not be affected by the extra 75 Å Ti.

The main conclusions from these experiments are as follows:
 i. SIV are reduced with the inclusion of an addition 75 A Ti underlayer
 ii. SIV visual inspection results are equivalent for SP and ST recipes
 iii. Yield results are statistically equivalent for both split legs
 iv. Metal sheet resistances are unaffected by the inclusion of the extra 75 Å Ti underlayer
 v. The current metal etch would be able to cope with the extra 75 Å Ti with no deterioration in metal continuity and bridging.

Figure 5:
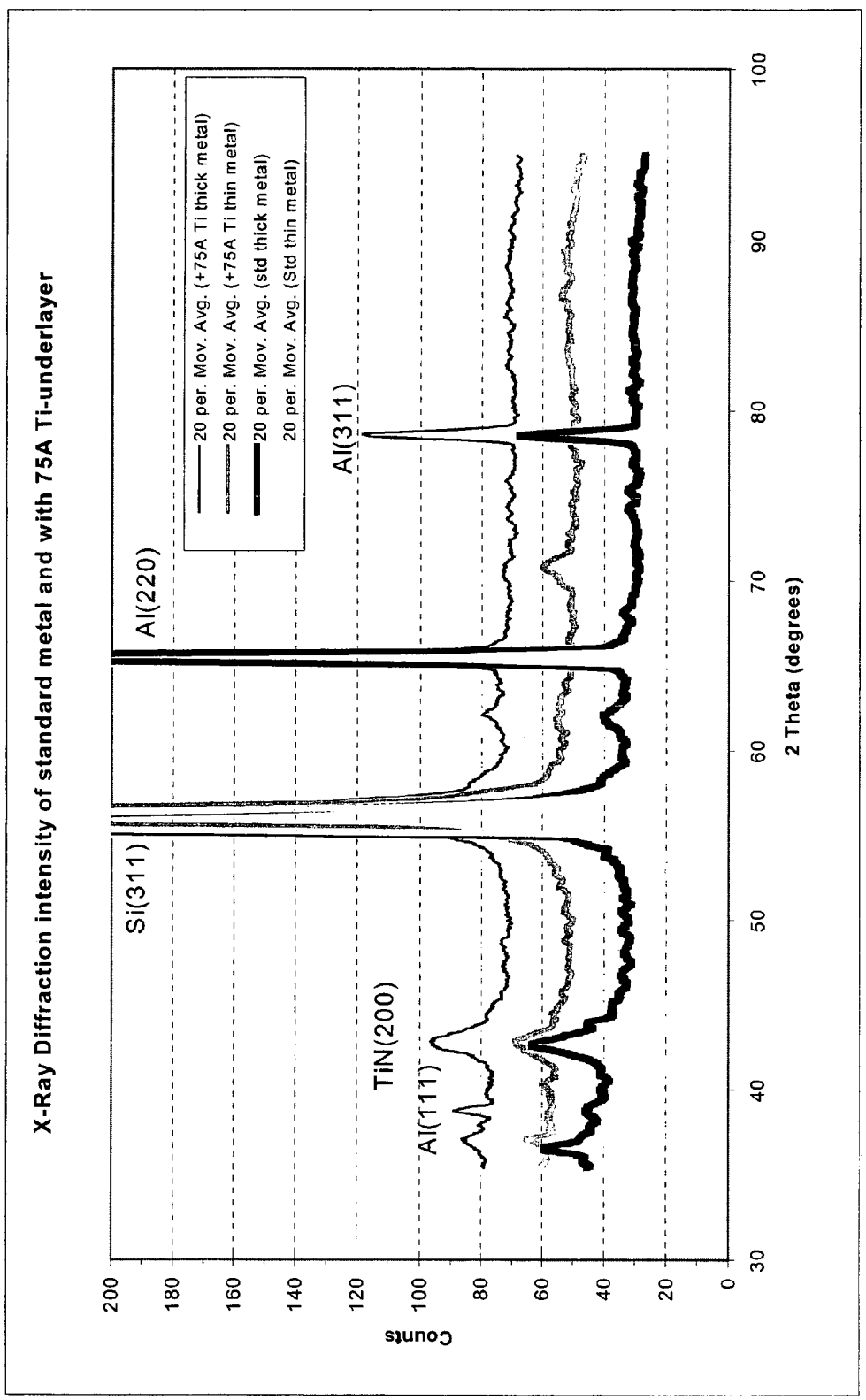
FIG. 5 shows the results of X-Ray diffraction analysis of various metals.

X-RAY Diffraction (XRD) analysis was performed to seek to determine the crystal orientation with the addition of the 75 Å Ti underlayer and the results are shown in FIG. 5. Compared with standard thin metal (i.e. the conventional layer with 4000 Å AlCu), thin metal with the Ti-underlayer becomes almost fully (220) orientated, and the (111) and (311) orientations become suppressed. Compared with standard thick metal (i.e. the conventional layer with 8000 Å AlCu), thick metal with the Ti-underlayer has more grains with (311) and (111) orientation.

Figure 6:
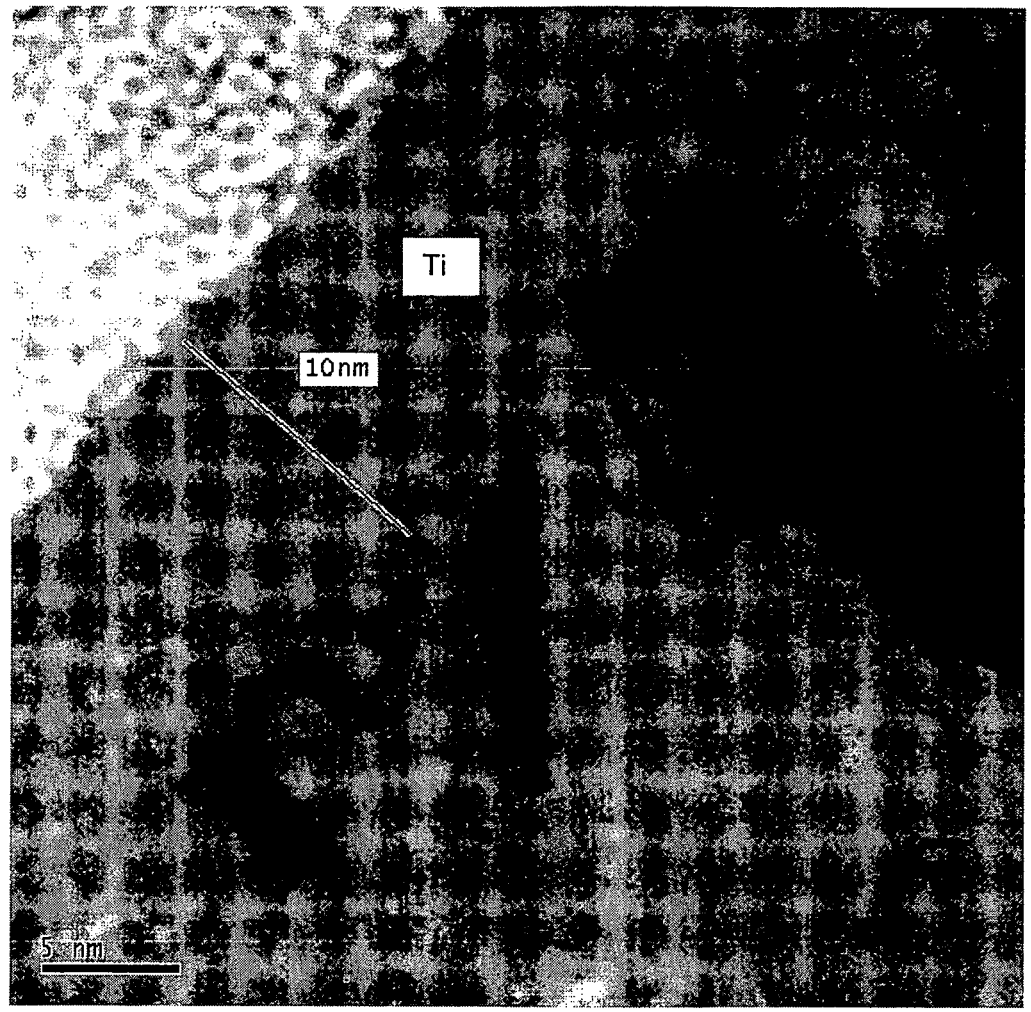
FIG. 6 is a TEM picture through an embodiment of the present invention.

To understand the physical thickness of the 75 Å Ti underlayer, a Transmission Electron Microscope (TEM) was used to provide a picture of the cross-section of a (thick) metal M5 layer, with the result shown in FIG. 6 for the lower part of the metal layer. The physical thickness of the 75 Å Ti underlayer is about 100 Å. This apparent difference is because the described thicknesses are actually calculated based on deposition time and deposited rate and may therefore vary from what is actually deposited. This is typical in the wafer fabrication business. Thus the physical thickness of a 75 Å layer may, in fact be between around 60 to 110 Å.

One hypothesis for the reason the invention works is that the improvement is a result of a change in the grain orientation of the metal lines (in particular the main metal, exemplified by AlCu), thereby increasing the resistance of the metal lines to stress migration and/or void nucleation resulting in better resistance to SIV. Another hypothesis is that the Ti underlayer has a coefficient of thermal expansion (CTE) in between the intermetal dielectric and the AlCu lines, which results in the Ti underlayer acting as a stress buffer layer.

Although the invention has been exemplified with layers of various specific thicknesses, the invention is not limited to these. Although most test were conducted with a 75 Å Ti underlayer, other thicknesses for the Ti underlayer would also work. (as is shown in the results in Table 5 above). Other thicknesses of TixTN also work (as is shown in the results in Tables 7 and 8 above). Other thicknesses of some of the other layers would also be expected to work.

Whilst the present invention has been exemplified by a AlCu metal line, it also covers lines of other metals and alloys, in particular other Aluminium alloys (for example with magnesium, silicon, a lanthanide or palladium).

Thus the present invention provides an improved product and process based on the addition of an extra Ti layer below a Ti rich TiN layer in a conductive line.

The invention claimed is:

1. A conductive line for a semiconductor device including:
 a first conductive layer;
 a Titanium layer;
 a first Titanium rich Titanium Nitride layer between the first conductive layer and the Titanium layer; and
 a second Titanium rich Titanium Nitride layer, and wherein the first conductive layer is between the first and second Titanium rich Titanium Nitride layers.

2. A conductive line according to claim 1, wherein the first conductive layer is in direct contact with the first Titanium rich Titanium Nitride layer.

3. A conductive line according to claim 1, wherein the Titanium layer is in direct contact with the first Titanium rich Titanium Nitride layer.

4. A conductive line according to claim 1, wherein the first conductive layer is a metal layer.

5. A conductive line according to claim 4, wherein the first conductive layer is an aluminium alloy.

6. A conductive line according to claim 5, wherein the aluminium alloy is an aluminium copper alloy.

7. A conductive line according to claim 1, wherein the Titanium layer is less than about $500 \times 10^{-10}$ m (500 Angstroms) thick.

8. A conductive line according to claim 7, wherein the Titanium layer is from about $60–110 \times 10^{-10}$ m (60–110 Angstroms) thick.

9. A conductive line according to claim 1, wherein the first Titanium rich Titanium Nitride layer is a $250–500 \times 10^{-10}$ m (250–500 Angstroms) layer.

10. A conductive line according to claim 1, wherein the first conductive layer is a 4000–8000×10–10 m (4000–8000 Angstroms) layer.

11. A process for manufacturing a conductive line, comprising the steps of:
   depositing a Titanium layer onto a substrate;
   depositing a first Titanium rich Titanium Nitride layer to the other side of said Titanium layer relative to said substrate;
   depositing a first conductive layer to the other side of said first Titanium rich Titanium Nitride layer relative to said Titanium layer; and
   depositing a second Titanium rich Titanium Nitride layer to the other side of said first conductive layer relative to said first Titanium rich Titanium Nitride layer.

12. A process according to claim 11, wherein the Titanium layer is deposited directly onto said substrate.

13. A process according to claim 12, wherein the first Titanium rich Titanium Nitride layer is deposited directly onto said Titanium layer.

14. A process according to claim 12, wherein the first conductive layer is deposited directly onto said first Titanium rich Titanium Nitride layer.

15. A process according to claim 11, wherein the first conductive layer is a metal layer.

16. A process according to claim 15, wherein the first conductive layer is an aluminium alloy.

17. A process according to claim 16, wherein the aluminium alloy is an aluminium copper alloy.

18. A process according to claim 11, wherein the Titanium layer is less than about 500×10–10 m (500 Angstroms) thick.

19. A process according to claim 18, wherein the Titanium layer is from about 60–110×10–10 m (60–110 Angstroms) thick.

20. A process according to claim 11, wherein the first Titanium rich Titanium Nitride layer is a 250–500×10–10 m (250–500 Angstroms) layer.

21. A process according to claim 11, wherein the first conductive layer is a 4000–8000×10–10 m (4000–8000 Angstroms) layer.

22. A silicon substrate having a plurality of conductive lines according to claim 1 thereon.

23. A semiconductor device including one or more conductive lines according to claim 1.

24. A memory including one or more conductive lines according to claim 1.

25. An integrated circuit including one or more conductive lines according to claim 1.

* * * * *